(12) United States Patent
Yu (10) Patent No.: US 11,462,264 B2
(45) Date of Patent: Oct. 4, 2022

(54) ADVANCED MEMORY STRUCTURE AND DEVICE

(71) Applicant: Yangtze Memory Technologies Co., Ltd., Wuhan (CN)

(72) Inventor: Dan Yu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 162 days.

(21) Appl. No.: 16/849,458

(22) Filed: Apr. 15, 2020

(65) Prior Publication Data
US 2021/0225438 A1 Jul. 22, 2021

Related U.S. Application Data

(63) Continuation of application No. PCT/CN2020/072760, filed on Jan. 17, 2020.

(51) Int. Cl.
| | | |
|---|---|---|
| G11C 11/44 | (2006.01) | |
| H01L 39/02 | (2006.01) | |
| H01L 39/16 | (2006.01) | |
| H01L 39/24 | (2006.01) | |

(52) U.S. Cl.
CPC .............. *G11C 11/44* (2013.01); *H01L 39/02* (2013.01); *H01L 39/16* (2013.01); *H01L 39/24* (2013.01)

(58) Field of Classification Search
CPC ........... G11C 11/44; G11C 11/02; G11C 7/04; H01L 39/02; H01L 39/16; H01L 39/24
See application file for complete search history.

(56) References Cited

U.S. PATENT DOCUMENTS

2014/0029607 A1   1/2014   Vasquez et al.

FOREIGN PATENT DOCUMENTS

| CN | 1039154 A | 1/1990 |
|---|---|---|
| CN | 101931045 A | 12/2010 |
| CN | 102334206 A | 1/2012 |
| CN | 103069595 A | 4/2013 |
| DE | 2731400 A1 | 3/1978 |
| GB | 1008422 A | 10/1965 |
| JP | S62172768 A | 7/1987 |
| JP | H0743922 B2 | 5/1995 |
| JP | H08203723 A | 8/2016 |
| TW | 201737251 A | 10/2017 |
| WO | 2014197095 A4 | 3/2015 |

*Primary Examiner* — Hoang-Quan Ho
(74) *Attorney, Agent, or Firm* — Anova Law Group, PLLC (57) ABSTRACT

Memory devices and methods are provided. In one aspect, a memory device may comprise a first field element, a second field element, a movable magnetic element, and a first heater. The first field element may be a superconductor. The second field element may be disposed facing the first field element and at a first distance from the first field element. The movable magnetic element may be repelled by the second field element and disposed in a space between the first field element and the second field element. The first heater may be arranged near the first field element. The movable magnetic element may move toward the first field element in response to a first electric current that passes through the first heater.

20 Claims, 8 Drawing Sheets

ADVANCED MEMORY STRUCTURE AND DEVICE

CROSS-REFERENCE TO RELATED APPLICATION

This application is a continuation of International Application No. PCT/CN2020/072760, filed on Jan. 17, 2020, the entire content of which is incorporated herein by reference.

FIELD OF THE TECHNOLOGY

This application relates to the field of memory and, more specifically, to methods and apparatus of memories based on superconductor technology.

BACKGROUND OF THE DISCLOSURE

As the most frequently used equipment, computers have become an indispensable part of our everyday lives. Both volatile memory and nonvolatile memory are critical components of a computer. Examples of memories include dynamic random-access memory (DRAM), static random-access memory (SRAM), and flash memory, etc. In some applications, the working temperature is very low. Hence, it is desirable to have memory devices that work at very low temperatures.

Superconductors are materials that conduct an electric current with no electrical resistance when the temperature drops below a certain critical temperature. The critical temperature is also called the transition temperature. Below the critical temperature, the material undergoes transition into the superconducting state. The critical temperature is very low, even for the high temperature superconductors. When a material transforms into the superconducting state, the Meissner effect (or Meissner-Ochsenfeld effect) occurs, which causes expulsion of a magnetic field from the interior of the material.

If a small magnet is brought above a superconductor, it will be repelled because the magnetic field causes electric currents to spontaneously flow on the surface of the superconductor. The currents produce mirror images of each pole of the magnet, which cancels out the magnetic fields inside the superconductor and levitates the magnet. Hence, the magnet becomes suspended in the air by the magnetic force. Magnetic levitation (maglev) or magnetic suspension is one of the most outstanding properties of superconductors, because levitating an object in the air using the magnetic field and without any support is so distinctive and remarkable. Currently, most superconductor magnetic suspension applications are often aimed at mechanical structures.

The disclosed methods and systems are directed to solve one or more problems set forth above and other problems.

SUMMARY

In one aspect of the present disclosure, a memory structure may comprise a first field element, a second field element, a movable magnetic element, and a first heater. The first field element may be a superconductor. The second field element may be disposed facing the first field element and at a first distance from the first field. The first and second field elements may be coupled to create a force field. The movable magnetic element may be repelled by the second field element and disposed in a space between the first field element and the second field element to be controlled by the force field. The first heater may be arranged near the first field element. The movable magnetic element may move toward the first field element in response to a first electric current that passes through the first heater.

In another aspect of the present disclosure, a memory device may comprise a control circuitry and at least one array of memory structures. Each memory structure may comprise a first field element, a second field element, a movable magnetic element, and a first heater. The first field element may be a superconductor. The second field element may be disposed facing the first field element and at a first distance from the first field. The first and second field elements may be coupled to create a force field. The movable magnetic element may be repelled by the second field element and disposed in a space between the first field element and the second field element to be controlled by the force field. The first heater may be arranged near the first field element. The movable magnetic element may move toward the first field element in response to a first electric current that passes through the first heater.

In another aspect of the present disclosure, a method may comprise depositing a first layer of a first material; forming a plurality of field elements out of the first material; depositing a second layer of a magnetic material; forming a plurality of magnetic elements out of the magnetic material; depositing a third layer of a conductive material; forming a plurality of conductors out of the conductive material; depositing a fourth layer of a superconducting material; forming a plurality of superconductors out of the superconducting material; depositing a fifth layer of an electrically resistive material; and forming a plurality of heaters out of the electrically resistive material. The second layer of the magnetic material may be disposed between two layers of a filling material. The plurality of magnetic elements may become movable after the filling material that surrounds the plurality of magnetic elements is removed.

In another aspect of the present disclosure, an electronic device may comprise a microprocessor, a memory device, a controller, an output module, and an input module. The controller may control the memory device. The memory device may comprise at least one array of memory structures. Each memory structure may comprise a first field element, a second field element, a movable magnetic element, and a first heater. The first field element may be a superconductor. The second field element may be disposed facing the first field element and at a first distance from the first field element. The movable magnetic element may be repelled by the second field element and disposed in a space between the first field element and the second field element. The first heater may be arranged near the first field element. The movable magnetic element may move toward the first field element in response to a first electric current that passes through the first heater.

Other aspects of the present disclosure can be understood by those skilled in the art in light of the description, the claims, and the drawings of the present disclosure.

DESCRIPTION OF EMBODIMENTS

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all the embodiments of the present disclosure. Features in various embodiments may be exchanged and/or combined. Other embodiments obtained by a person skilled in the art based on the embodiments of the present disclosure without creative efforts shall fall within the protection scope of the present disclosure.

Figure 1A:
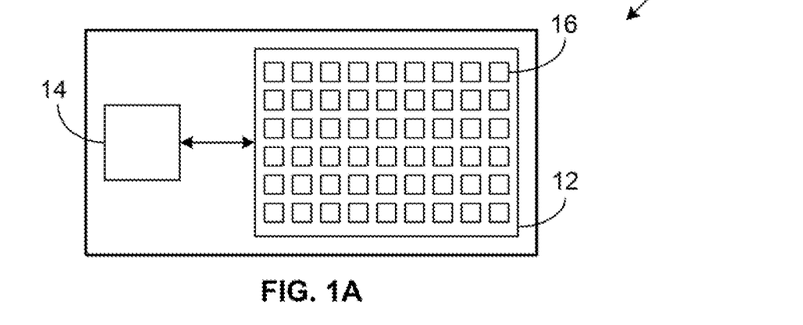
FIG. 1A illustrates a schematic block diagram of a memory device according to an embodiment of the present disclosure.

FIG. 1A is a schematic block diagram illustrating a memory device 10, consistent with embodiments of the present disclosure. The device 10 may include a memory region 12 and a control circuitry 14. The memory region 12 may comprise an array of memory structures 16. The memory device 10 may perform operations including a read operation, a write operation, and/or an erase operation under the control of the control circuitry 14. The memory region may comprise more than one array of the memory structures 16 (e.g., memory cells). In some embodiments, the device 10 may include multiple memory regions, where each memory region may comprise one or more arrays of the memory structures 16. The memory structures will be discussed in detail below. Optionally, the device 10 may include different types of memories, such as magnetic memories to be discussed, DRAM, SRAM, and flash, etc.

The control circuitry 14 may comprise command/address/clock input circuitry, decoders, voltage and timing generators, input/output circuitry, etc. In some embodiments, the control circuitry 14 may be provided on the same die as the memory region 12. In some other embodiments, the control circuitry 14 may be provided on a separate die. In some embodiments, the control circuitry 14 may include a microcontroller, special purpose logic circuitry, or another suitable processor. In some other embodiments, the control circuitry 14 may include embedded memory for storing data and fetching data. Alternatively, the memory device 10 may not include the control circuitry 14, and may instead rely upon external control. For example, an external control may be provided by a host electronic device or by a processor or controller that is separate from the memory device 10.

Figure 1B:
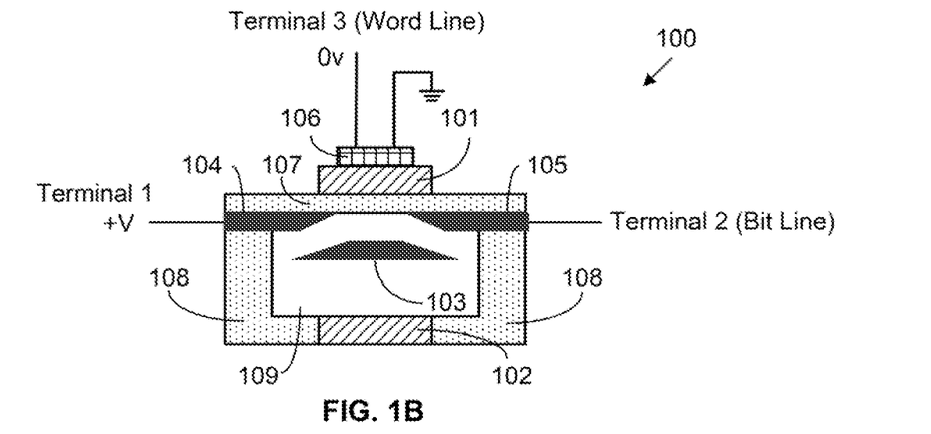
FIGS. 1B and 1C illustrate schematic structural diagrams of a magnetic memory structure according to another embodiment of the present disclosure.
Figure 1C:
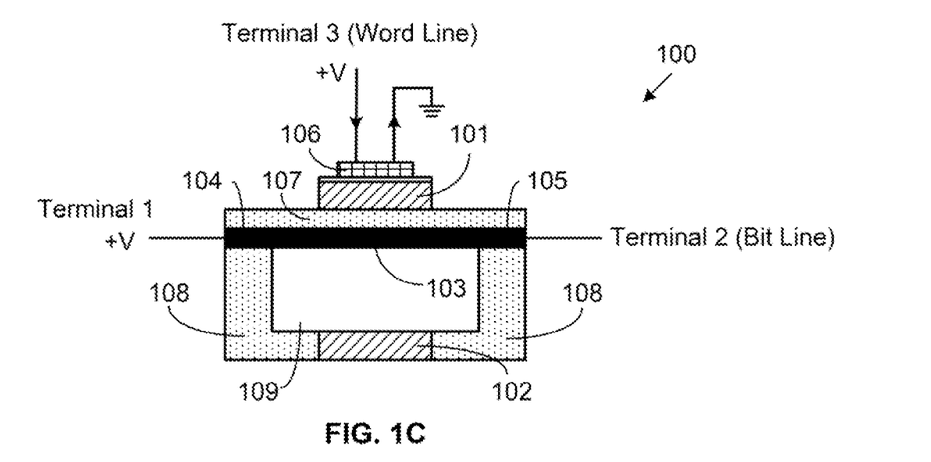

The memory structure 16 may be a memory structure based on the principle of superconductor/magnetic levitation. FIGS. 1B and 1C show schematic structural diagrams of a magnetic memory structure 100 in cross-sectional views, consistent with embodiments of the present disclosure. As shown in FIGS. 1B and 1C, the structure 100 may include a first superconductor 101, a second superconductor 102, a movable magnet 103, and conductor layers 104 and 105. The first and second superconductors may be arranged facing each other and separated by a predetermined distance. The movable magnet 103 may be arranged between the first and second superconductors. The conductor layers 104 and 105 may be disposed between the first superconductor and the movable magnet. The conductor layers 104 and 105 may be arranged side by side and separated by another distance.

Further, the structure 100 may comprise a heater 106, an isolation layer 107, and an isolation region 108. The heater 106 may be disposed near and above the first superconductor 101. The isolation layer 107 may be partially deposited on the conductor layers 104 and 105 and sandwiched between the first superconductor 101 and the conductor layer 104 and 105. The isolation region 108 may surround a space 109 partially. The first superconductor 101 may be deposited on the isolation layer 107. The space 109 may be arranged between the first and second superconductors 101 and 102 and provide a free space where the movable magnet 103 may move up or down in certain ways. Terminals 1 may be electrically connected to the conductor layer 104. Terminal 2 may be electrically connected to the conductor layer 105 and a bit line. Terminal 3 may be electrically connected to heater 106 and a word line.

The first and second superconductors 101 and 102 may comprise one or more superconductive materials. Examples of the superconductive materials may include $YBa_2Cu_3O_7$ and $HgBa_2Ca_2Cu_3O_3$, whose critical temperatures are −180.15° C. and −139.15° C., respectively. The superconductors 101 and 102 may be grown on a substrate or an object. In some embodiments, the superconductors 101 and 102 may be in a thin-film form. In some other embodiments, the superconductors 101 and 102 may be in a bulk form. In some embodiments, the superconductors 101 and 102 may have a same shape. In some other embodiments, the superconductors 101 and 102 may have different shapes. The shapes may include a square shape, a rectangular shape, a circular shape, an oval shape, or an irregular shape. In some embodiments, the dimensions of the superconductors 101 and 102 may be same. In some other embodiments, the dimensions of the superconductors 101 and 102 may be different. The thin-film or bulk factor, the shape factor, and the dimensional factor may be used to determine the position of the movable magnet 103 when the movable magnet 103 is suspended in the space 109.

The movable magnet 103, as a magnetic movable element, may comprise one or more permanent magnetic materials, such as NdFeB, SmCo, or AlNiCo. The magnet 103 may also comprise one or more ferromagnetic materials, such as FeO, $Fe_2O_3$, or $BaO.6Fe_2O_3$. Like the superconductors 101 and 102, the magnet 103 may have a shape such as a square shape, a rectangular shape, a circular shape, an oval shape, or an irregular shape.

The conductor layers 104 and 105 and the superconductor 101 may be electrically isolated from each other. The conductor layers 104 and 105 may be separated by a portion of the space 109 or an electrically insulating material (not shown). In some embodiments, the layers 104 and 105 may be electrically conductive and have a sheet-like structure. For example, the layers 104 and 105 may include metal such as copper. The layers 104 and 105 may also include semiconductor materials such as n-type polycrystalline silicon. The shape of the layers 104 and 105 may include a square shape, a rectangular shape, a circular shape, an oval shape, or an irregular shape. In certain embodiments, as shown in FIGS. 1B and 1C, the magnet 103 may be in a trapezoid shape, and the conductor layers 104 and 105 may have the matching shape to form a conductive layer when coupled together.

The isolation layer 107 may comprise an electrically insulating material, such as silicon dioxide or silicon nitride, which electrically isolates the superconductor 101 from the conductor layers 104 and 105. The isolation region 108 may include one or more isolation regions which may comprise one or more electrically insulating materials. The space 109 may be arranged between the first and second superconductors 101 and 102 or between the isolation layer 107 and the second superconductor 102. The space 109 may be surrounded by the superconductors 101 and 102, the conductor layers 104 and 105, the isolation layer 107, and the isolation region 108. The top part of the space 109 may be defined by the conductor layers 104 and 105 and a portion of the isolation layer 107. The bottom part of the space 109 may be defined by the superconductor 102 and a portion of the isolation region 108. The sidewalls of the space 109 may be defined by the isolation region 108. In some embodiments, the space 109 may be made by dry etching methods. In some other embodiments, the space 109 may be made by molding methods. In some embodiments, the space 109 may be in a vacuum state. In some other embodiments, the space 109 may be filled with the air at the ambient atmospheric pressure. In additional embodiments, the space 109 may be filled with an inert gas such as a nitrogen gas at a certain pressure. As the magnet 103 moves up and down during the operation of the structure 100, a vacuum condition may be desirable in some embodiments as the air resistance is eliminated.

Between the superconductor 101 and the heater 106, there may be a thin isolation layer (not shown). The thin isolation layer may make the superconductor 101 and the heater 106 electrically isolated from each other. In some embodiments, the heater 106 may have a sheet-like structure. It may comprise an electrically resistive material with high electrical resistivity. For example, the heater 106 may be made of nichrome that includes 80% nickel and 20% chromium. Besides a metallic material, the heater 106 may also comprise a ceramic material or a composite material. Hence, in some embodiments, the heater 106 may have a metallic heating element. In some other embodiments, the heater may have a ceramic heating element or a composite heating element. In addition, in some embodiments, the heater 106 and the superconductor 101 may have a same shape and same dimensions. In some other embodiments, the heater 106 and the superconductor 101 may have different shapes and different dimensions.

An example operation of the magnetic memory structure 100 is described below. Assuming that initially the temperature is below the critical temperature of the superconductors 101 and 102 and the terminal 3 is off line or connected to the ground, i.e., the heater 106 is power off. As the magnet 103 may be close to the superconductor 101, a strong magnetic field may be induced by the current that flows at the surface of the superconductor 101. Inside the superconductor 101, the magnetic fields are cancelled out. Outside the superconductor, the magnetic levitation may take effect, i.e., the induced magnetic field is strong which may repel and push the magnet 103 downwardly. Since the magnet 103 may also be close to the superconductor 102, the magnetic levitation caused by the superconductor 102 may happen as well. The repulsive magnetic field around the superconductor 102 may repel the magnet 103 and push it upward. Thus, the magnet 103 may be levitated at a position where the equilibrium may be attained. The equilibrium may be between the repulsive force from the superconductor 102 and the repulsive force from the superconductor 101 plus the gravitational force of the magnet 103. Hence, as shown in FIG. 1B, the magnet 103 may be suspended at the equilibrium position in the space 109 when the heater 106 is off.

Thus, the superconductor 101 and the superconductor 102 are coupled together to generate a force field to control the location of the magnet 103. The force field may be magnetic, or may also be electric. The superconductor 101 and the superconductor 102 may be considered as the first field element and the second field element, respectively, that are coupled together to create the force field to control the location of the magnet 103.

Further, the equilibrium position of the magnet 103 may be determined by the two superconductors 101 and 102 and the weight of the magnet 103. In some embodiments, the gravitational force may be much smaller than the repulsive force of the superconductor 102. In some other embodiments, the gravitational force of the magnet 103 may be close to but still smaller than the repulsive force of the superconductor 102 when the magnet 103 contacts or touches the conductor layers 104 and 105. It is known that the closer a magnet is to a superconductor, the greater repulsive force it experiences. Hence, the relative strength between the superconductors 101 and 102 may determine which one the magnet 103 is closer to. For example, if the superconductor 102 produces a stronger magnetic field, the magnet 103 may be pushed to a position closer to the superconductor 101. When the magnet 103 is in suspended state, the conductor layers 104 and 105 are electrically isolated from each other and so are the terminals 1 and 2. Therefore, when the heater is power off, the magnet 103 may be suspended in the space 109 and a circuit between the terminals 1 and 2 may be open.

When an electric current is applied to the heater 106 after the terminal 3 is connected to an electric potential +V, the current may generate heat through Joule heating at the heater 106. The heat generated may spread to the superconductor 101 by heat transfer. When the superconductor 101 is heated above the critical temperature, it loses the superconducting state and the repulsive force from it disappears. As a result, the repulsion from the superconductor 102 may push the magnet 103 upward until the magnet is blocked by the conductor layers 104 and 105, as long as the repulsive force is larger than the gravitational force of the magnet 103. Then, the magnet 103 may be in contact with the conductor layers 104 and 105. The conductor layers 104 and 105 may become electrically coupled. When the electric current is applied to the heater 106 continuously, the repulsion from the superconductor 102 may keep the conductor layer 104 and 105 electrically coupled by pushing the magnet 103 upward, as shown in FIG. 1C. Therefore, when the heater 106 is power on, the magnet 103 may be pushed up and the terminals 1 and 2 may be electrically coupled.

Between terminals 1 and 2, assuming that a relatively high resistance value or open circuit means data "0", while a relatively low resistance value means data "1". Then, the magnet 103 in suspended state may correspond to data "0" and the magnet 103 being pushed against the conductor layers 104 and 105 may correspond to data "1". As such, the configurations shown in FIGS. 1B and 1C may represent the two memory states. The memory structure 100 may be switched between the two states by applying or stopping an electric current to the heater 106. The magnetic memory structure 100 has a simple structure, fast read speed, good cycling endurance, and works at very low temperatures.

In some other embodiments, the superconductor 102 may be arranged above the magnet 103 and on the top of the structure 100, while the superconductor 101 along with the heater 106 and the conductor layers 104 and 105 may be arranged below the magnet 103. Then, the structure 100 may have a different configuration with the same or similar components. The superconductor 101 may be arranged above the heater 106. The conductor layers 104 and 105 may be arranged above the superconductor 101. And the superconductor 102 may be arranged facing and above the superconductor 101 and conductor layers 104 and 105. In this configuration, the space 109 may remain unchanged but be turned upside down. The superconductors 101 and 102 may remain the same, assuming that the expulsive force from the superconductor 101 is larger than the gravitational force of the magnet 103. The operation of the structure 100 may remain unchanged.

Figure 1D:
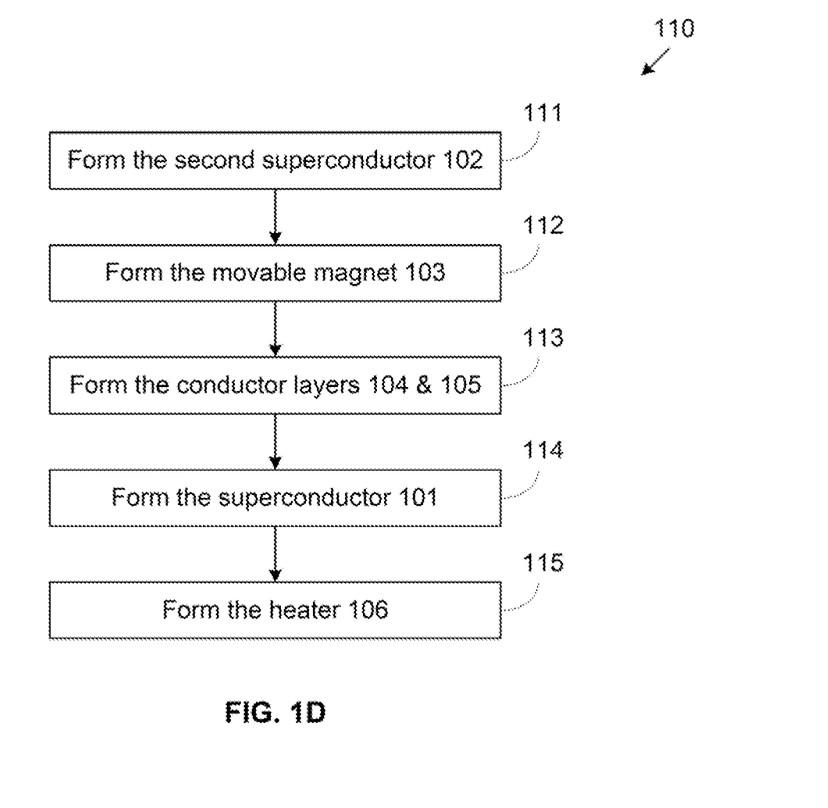
FIG. 1D illustrates a schematic flow chart of fabrication of a magnetic memory structure according to another embodiment of the present disclosure.

FIG. 1D is a flow chart 110 illustrating a schematic fabrication process of the structure 100, consistent with embodiments of the present disclosure. The fabrication process 110 is applicable to the structure 100 as well as batch fabrication of arrays of the structures 100. At step 111, a layer of a first superconducting material may be deposited on a substrate. The first superconductor material may be etched out selectively to form the second superconductor 102. A photoresist layer and a mask may be used in a dry etching process. Then, the second superconductor 102 may be covered by a first layer of an electrically insulating material. At step 112, a layer of magnetic material may be deposited. The magnetic material may be etched out selectively to form the movable magnet 103 that will be released and become movable later. Next, the movable magnet 103 may be covered by a second layer of an electrically insulating material. Materials forming the first and second layers may be called filling materials, as the filling materials fill the space 109 temporarily. The filling materials may be removed by, for example, wet etching, to free the movable magnet 103.

After step 112, an etch-out step may be performed for creating the space 109. For example, parts of the first and the second layers may be removed except the region of the space 109. Then the exposed areas may be deposited with another electrically insulating material that is different from the filling materials.

At step 113, a layer of conductive material may be deposited. The conductive material may be etched out selectively to form the conductor layers 104 and 105. The conductor layers 104 and 105 may be covered by a third layer of an electrically insulating material. At step 114, a layer of a second superconductive material may be deposited. The second superconductive material may be etched out selectively to form the first superconductor 101. The first superconductor 101 may be covered by a fourth layer of an electrically insulating material. At step 115, a layer of an electrically resistive material may be deposited. The electrically resistive material may be etched out selectively to form the heater 106. The space 109 may be formed by removing the filling materials that surround the movable magnet 103 by wet etching at a selected time. The movable magnet 103 may be released and become movable after the space 109 is created.

After step 115, contact metal such as copper may be deposited to form the terminals 1, 2, and 3. In some embodiments, the first to fourth layers may comprise a same insulating material. In some other embodiments, the first to fourth layers may comprise different insulating materials.

Figure 2A:
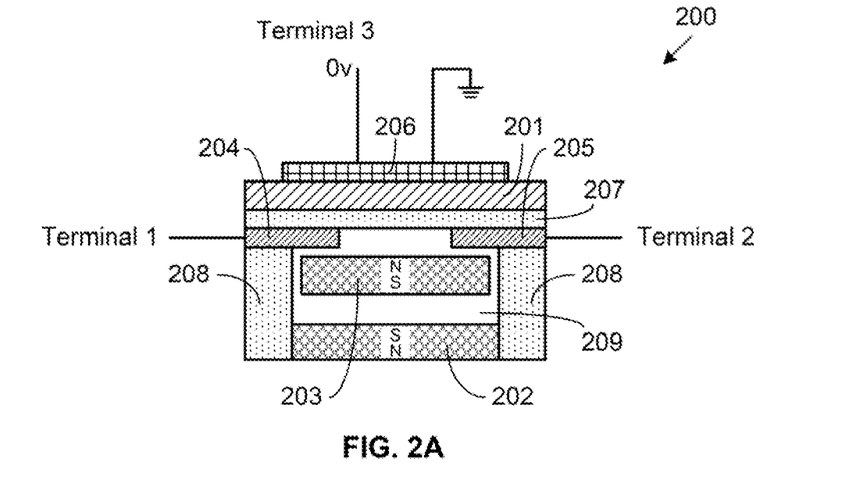
FIGS. 2A and 2B illustrate schematic structural diagrams of another magnetic memory structure according to another embodiment of the present disclosure.
Figure 2B:
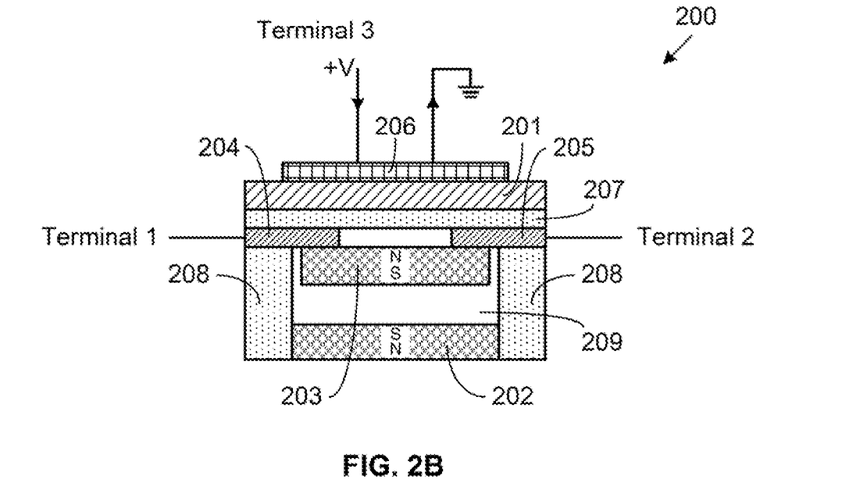

FIGS. 2A and 2B show schematic structural diagrams of another magnetic memory structure 200 in cross-sectional views, consistent with embodiments of the present disclosure. As depicted in FIGS. 2A and 2B, the structure 200 may include a superconductor 201, a bottom magnet 102, a movable magnet 203, and conductor layers 204 and 205. As such, the structure 200 is similar to the structure 100 shown in FIGS. 1A and 1B except that the bottom magnet 202 replaces the second superconductor 102 of the structure 100. The superconductor 201 and the bottom magnet 202 may be arranged facing each other and separated by a predetermined distance. The movable magnet 203 may be arranged between the superconductor 201 and the bottom magnet 202. The conductor layers 104 and 105 may be disposed between the superconductor 201 and the movable magnet 203. The conductor layers 204 and 205 may be arranged side by side and separated by another distance.

The structure 200 may further comprise a heater 206, an isolation layer 207, and an isolation region 208. The heater 206 may be disposed near and above the superconductor 201. The isolation layer 207 may be partially deposited on the conductor layers 204 and 205 and sandwiched between the superconductor 201 and the conductor layer 204 and 205. The isolation region 208 may surrounds a space 209 partially. The superconductor 201 may be deposited on the isolation layer 207. The space 209 may be arranged between the superconductor 201 and the bottom magnet 202. The space 109 may provide a free space where the movable magnet 203 may move up or down in certain ways. Terminals 1, 2, and 3 are electrically connected to the conductor layer 204, the conductor layer 205, and the heater 206, respectively.

Like the superconductor 101, the superconductor 201 may comprise one or more superconductive materials.

Like the magnet 103, the movable magnet 203 may comprise one or more magnetic materials. In some embodiment, the bottom magnet 202 and the movable magnet 203 may comprise a same material and same dimensions. In some other embodiments, the bottom magnet 202 and the movable magnet 203 may comprise different materials and different dimensions. It may be arranged such that the two magnets have same poles facing each other. For example, the bottom magnet 202 may have a south pole facing upward, while the movable magnet 203 may have a south pole facing downward, as shown in FIG. 2A. As a south pole repels a south pole, the two magnets may repel each other, i.e., the bottom magnet 202 may push the movable magnet 203 upward.

The conductor layers 204 and 205 and the superconductor 201 may electrically isolated from each other. The conductor layers 204 and 205 may be separated by a portion of the space 209 or an electrically insulating material (not shown).

The isolation layer 207 may comprise an electrically insulating material, which may electrically isolate the superconductor 201 from the conductor layers 204 and 205. The isolation region 208 may include one or more isolation regions that may comprise one or more electrically insulating materials. The space 209 may be between the superconductor 201 and the magnet 202 or between the isolation layer 207 and the magnet 202. The space 209 may be surrounded by the superconductor 201, the conductor layers 204 and 205, the isolation layer 207, the magnet 202, and the isolation region 208. The top part of the space 209 may be defined by the conductor layers 204 and 205 and a portion of the isolation layer 207. The bottom part may be defined by the magnet 202 or the magnet 202 plus parts of the isolation region 208. The sidewalls may be defined by the isolation region 208.

A thin isolation layer (not shown) may be arranged between the superconductor 201 and the heater 206. The thin layer may contain an electrically insulating material and make the superconductor 201 and the heater 206 isolated from each other. The heater 206 may be made of a high-resistivity material.

An example operation of the magnetic memory structure 200 may be described below. Assuming that initially the temperature is below the critical temperature of the superconductor 201 and the terminal 3 is off line, i.e., the heater 206 is power off. As the magnet 203 may be close to the superconductor 201, a strong magnetic field may be induced by the current that flows at the surface of the superconductor 201. Inside the superconductor 201, the magnetic fields are cancelled out. Outside the superconductor, the induced magnetic field may repel and push the magnet 203 downwardly. Since the magnet 203 is also pushed upward by the bottom magnet 202, the magnet 203 may be suspended at an equilibrium position in the space 209. The equilibrium is between a repulsive force from the superconductor 201 and another repulsive force from the bottom magnet 202 plus the gravitational force of the magnet 203. Hence, as shown in FIG. 2A, the magnet 203 may be suspended at the equilibrium position in the space 209 when the heater 206 is off. In some embodiments, the equilibrium position may be arranged close to the superconductor 201, which may limit the range of movement of the magnet 203 and improve the stability of the operation.

Hence, the superconductor 201 and the bottom magnet 202 may be coupled together to generate a force field to control the location of the magnet 203. The force field may be magnetic. The superconductor 201 and the bottom magnet 202 may be considered as the first field element and the second field element, respectively. Then, the first and second field elements may be coupled together to create the force field to control the location of the magnet 203.

Further, the equilibrium position of the magnet 203 may be determined by the two repulsive forces and the weight of the magnet. When the magnet 203 is in suspended state, the conductor layers 204 and 205 are electrically isolated from each other and so are the terminals 1 and 2. Therefore, when the heater is power off, the magnet 203 is suspended in the space 209 and a circuit between the terminals 1 and 2 is open.

When an electric current is applied to the heater 206 after the terminal 3 is connected to an electric potential +V, the current may generate heat through Joule heating at the heater 206. The heat generated may spread to the superconductor 201. When the superconductor 201 is heated above the critical temperature, it loses the superconducting state and the repulsive force. As a result, the repulsion from the bottom magnet 202 may push the magnet 203 upward until the magnet is stopped by the conductor layers 204 and 205. Then, the magnet 203 may be in contact with the conductor layers 204 and 205 and make them electrically coupled. When the electric current is applied to the heater 206 continuously, the repulsion from the bottom magnet 202 may keep pushing the magnet 203 upward and keep the conductor layers 204 and 205 coupled electrically, as shown in FIG. 2B. Therefore, when the heater is power on, the magnet 203 may be pushed up and the terminals 1 and 2 may be coupled electrically.

Between terminals 1 and 2, assuming that a relatively high resistance value or open circuit means data "0", while a relatively low resistance value means data "1". Then, the magnet 203 in suspended state may correspond to data "0" and the magnet 203 being pushed against the conductor layers 204 and 205 may correspond to data "1". As such, the configurations shown in FIGS. 2A and 2B may represent the two memory states. The memory structure 200 may be switched between the two states by applying or stopping an electric current applied to the heater 206.

In some other embodiments, the magnet 202 may be arranged above the superconductor 201 and on the top of the structure 200, while the superconductor 201 along with the heater 206 and the conductor layers 204 and 205 may be arranged below the magnets 202 and 203. Then, the structure 200 may have a different design with the same or similar components. The superconductor 201 may be arranged above the heater 206. The conductor layers 204 and 205 may be arranged above the superconductor 201. The magnet 202 may be arranged facing and above the superconductor 201. In this configuration, the space 209 may remain unchanged but be turned upside down. The superconductor 201 and the magnet 202 may remain the same, assuming that the expulsive force from the superconductor 201 is larger than the gravitational force of the magnet 203. The operation of the structure 200 may remain unchanged.

Figure 3A:
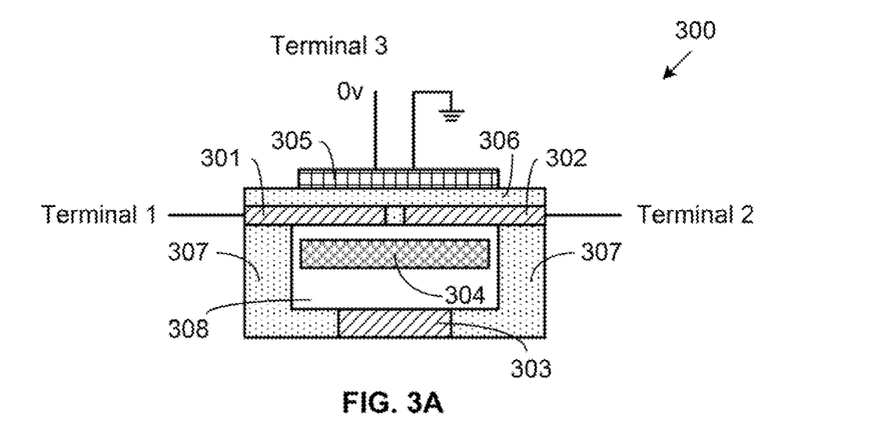
FIGS. 3A and 3B illustrate schematic structural diagrams of another magnetic memory structure according to another embodiment of the present disclosure.
Figure 3B:
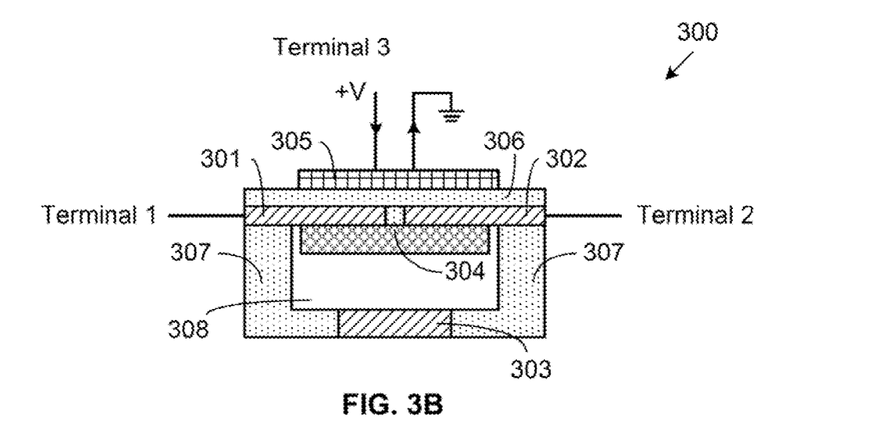

FIGS. 3A and 3B show schematic structural diagrams of another magnetic memory structure 300 in cross-sectional views, consistent with embodiments of the present disclosure. As shown in FIGS. 3A and 3B, the structure 300 may include top superconductors 301 and 302, a bottom superconductor 303, and a movable magnet 304. The structure 300 is similar to the structure 100 shown in FIGS. 1A and 1B except that the top superconductors 301 and 302 replace the superconductor 101 and the conductor layers 104 and 105 of the structure 100. As depicted in FIG. 3A, the top superconductors 301 and 302 may be arranged side by side and electrically isolated. The top superconductors 301 and 302 and the bottom superconductor 303 may be arranged facing each other and separated by a predetermined distance. The movable magnet 304 may be arranged between the top superconductors 301 and 302 and the bottom superconductor 303.

Further, the structure 300 may comprise a heater 305, an isolation layer 306, and an isolation region 307. The heater 305 may be disposed near and above the top superconductors 301 and 302. The isolation layer 306 may be deposited on the top superconductors 301 and 302 and sandwiched between the top superconductors 301 and 302 and the heater 305. The isolation region 307 may surround a space 308 partially. The space 308 may also be surrounded by the top superconductors 301 and 302 and the bottom superconductor 303. The space 308 may provide a free space where the movable magnet 304 may move up or down in certain ways. The heater 305 may be deposited on the isolation layer 306. Terminals 1, 2, and 3 may be electrically connected to the superconductor 301, the superconductor 302, and the heater 305, respectively.

Like the superconductor 101, the superconductors 301, 302, and 303 may comprise one or more superconductive materials. The superconductors 301 and 302 may be separated by a portion of the space 308 or an electrically insulating material, i.e., being separated by another predetermined distance. Like the magnet 103, the movable magnet 304 may comprise one or more magnetic materials.

The isolation region 307 may include one or more isolation regions which may comprise one or more electrically insulating materials. The space 308 may be arranged between the top superconductors 301 and 302 and the bottom superconductor 303. The space 308 may be surrounded by the superconductors 301, 302, and 303, the isolation layer 306, and the isolation region 307. The top part of the space 308 may be defined by the top superconductors 301 and 302 and a portion of the isolation layer 306. The bottom part of the space 308 may be defined by the bottom superconductor 303 and parts of the isolation region 307. The sidewalls may be defined by the isolation region 307. The heater 305 may be made of a high-resistivity material.

An example operation of the magnetic memory structure 300 is described below. Assuming that initially the temperature is below the critical temperature of the superconductors 301, 302, and 303 and the terminal 3 is off line, i.e., the heater 305 is power off. As the magnet 304 may be close to the superconductors 301 and 302, strong magnetic fields may be induced by the currents that flow at the surfaces of the superconductor 301 and 302. Outside the superconductors, the induced magnetic fields may be strong which may repel and push the magnet 304 downwardly. Since the magnet 304 may also be close to the superconductor 303, the repulsive magnetic field around the superconductor 303 may repel the magnet 304 and push it upward. Thus, the magnet 304 may be levitated at an equilibrium position in the space 308. The equilibrium may be between repulsive forces from the superconductors 301 and 302 and the other repulsive force from the superconductor 303 plus the gravitational force of the magnet 304. Hence, as shown in FIG. 3A, the magnet 304 may be suspended at the equilibrium position when the heater 305 is off.

Thus, the superconductors 301, 302, and 303 may be coupled together to generate a force field to control the location of the magnet 304. The force field may be magnetic. The superconductor 301 and the superconductor 303 may be considered as the first field element and the second field element, respectively. The superconductor 302 may be considered as the third field element. Then, the first, second, and third field elements may be coupled together to create the force field to control the location of the magnet 304.

Further, the equilibrium position of the magnet 304 may be determined by the three superconductors and the weight of the magnet 304. In some embodiments, the gravitational force may be arranged much smaller than the repulsive force of the superconductor 303. In some other embodiments, the gravitational force of the magnet 304 may be arranged close to but still smaller than the repulsive force of the superconductor 303 when the magnet 304 contacts or touches the superconductors 301 and 302. Again, the relative strength of the superconductors may determine where the equilibrium position is. For example, when the superconductor 303 produces a stronger magnetic field, the equilibrium position may be closer to the superconductors 301 and 302. When the magnet 304 is in suspended state, the superconductors 301 and 302 are electrically isolated from each other and so are the terminals 1 and 2. Therefore, when the heater 305 is power off, the magnet 304 is suspended in the space 308 and a circuit between the terminals 1 and 2 is open.

When an electric current is applied to the heater 305 after the terminal 3 is connected to an electric potential +V, the current may generate heat through Joule heating at the heater 305. The heat generated may spread to the superconductors 301 and 302. When the superconductors 301 and 302 are heated above the critical temperature, they lose superconductivity and the repulsion forces from them disappear. As a result, the repulsion from the superconductor 303 may push the magnet 304 upward until the magnet is blocked by the superconductors 301 and 302. Then, the magnet 304 may be in contact with the superconductors 301 and 302, which may become coupled electrically. When the electric current is applied to the heater 305 continuously, the repulsion from the superconductor 303 may keep the superconductors 301 and 302 electrically connected, as shown in FIG. 3B. Therefore, when the heater 305 is power on, the magnet 304 may be pushed up and the terminals 1 and 2 may be coupled electrically.

Between terminals 1 and 2, assuming that a relatively high resistance value or open circuit means data "0", while a relatively low resistance value means data "1". Then, the magnet 304 in a suspended state may correspond to data "0" and the magnet 304 being pushed against the superconductors 301 and 302 may correspond to data "1". As such, the configurations shown in FIGS. 3A and 3B may represent the two memory states. The memory structure 300 may be switched between the two states by applying or stopping an electric current to the heater 305.

In some other embodiments, the superconductor 303 can be arranged above the magnet 304 and on the top of the structure 300, while the superconductors 301 and 302 along with the heater 305 may be arranged below the magnet 304. Then, the structure 300 may have a different design with the same or similar components. The superconductors 301 and 302 may be arranged above the heater 305. The superconductor 303 may be arranged facing and above the superconductors 301 and 302. The space 308 may remain unchanged but be turned upside down. The superconductors 301, 302, and 303 may remain the same, assuming that the expulsive forces from the superconductors 301 and 302 are larger than the gravitational force of the magnet 304. The operation of the structure 300 may remain unchanged.

Figure 4A:
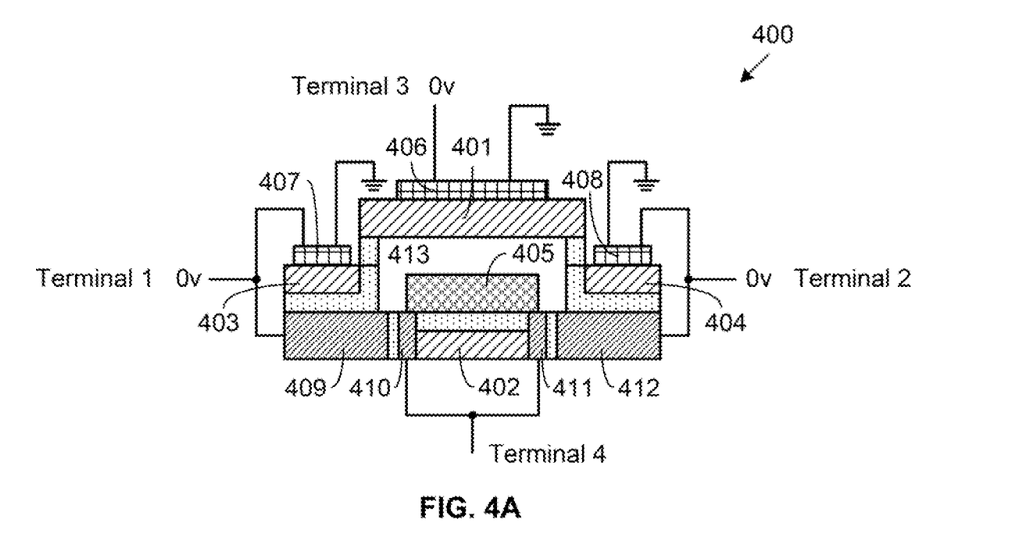
FIGS. 4A, 4B, 4C, and 4D illustrate schematic structural diagrams of another magnetic memory structure according to another embodiment of the present disclosure.

FIGS. 4A, 4B, 4C, and 4D show schematic structural diagrams of a nonvolatile magnetic memory structure 400 in cross-sectional views in a vertical plane, consistent with embodiments of the present disclosure. As shown in FIG. 4A, the structure 400 may include a top superconductor 401, a bottom superconductor 402, a left superconductor 403, a right superconductor 404, and a movable magnet 405. The top and bottom superconductors may be arranged facing each other and separated by a predetermined distance along a vertical direction. The left and right superconductors may be arranged facing each other and separated by another predetermined distance along a horizontal direction. The movable magnet 405 may be arranged between the top and bottom superconductors 401 and 402 and between the left and right superconductors 403 and 404.

The structure 400 may further comprise heaters 406, 407, and 408 that are disposed near the top superconductor 401, the left superconductor 403, and the right superconductor 404, respectively. The structure 400 may also comprise conductor regions 409, 410, 411, and 412. The four superconductors and three heaters may be separated and isolated from each other electrically by isolation layers or isolation regions. Some of isolation layers or regions may be reflected by objects which are not indicated by a reference numeral in the FIGS. 4A-4D. A space 413 may be arranged between the top and bottom superconductors 401 and 402 and between the left and right superconductors 403 and 404. The space 413 may provide a free space where the movable magnet 405 may move around in certain ways. Terminal 1 may be electrically connected to the conductor region 409 and the heater 407. Terminal 2 may be electrically connected to the conductor region 412 and the heater 408. Terminal 3 may be electrically connected to the heater 406. Terminal 4 may be electrically connected to the conductor regions 410 and 411.

Like the superconductor 101, the superconductors 401-404 may comprise one or more superconductive materials.

In some embodiments, the superconductors 403 and 404 may comprise a same structure, same dimensions, and same materials for producing similar repulsive forces in opposite directions. In some other embodiments, the superconductors 403 and 404 may be thin-film superconductors. The thin-film superconductors 403 and 404 may be disposed on the left and right sides of the space 413 with thin-film layers parallel to a vertical axis.

Like the magnet 103, the movable magnet 405 may comprise one or more magnetic materials. The conductor regions 409-412 may each have a sheet-like structure and comprise one or more conductive materials. The isolation layers and regions may comprise one or more electrically insulating materials.

The space 413 may be surrounded by the four superconductors, the four conductor regions, and parts of the isolation layers and regions. The top part of the space 413 may be defined by the superconductor 401. The bottom part of the space 413 may be defined by the superconductor 402 and some parts of the conductor regions and isolation regions. The sidewalls may be defined by the superconductors 403 and 404 and some other parts of the isolation regions. The heaters 406-408 may be made of a high-resistivity material.

An example operation of the magnetic memory structure 400 is described below. Assuming that initially the temperature is below the critical temperature of the superconductors 401-404 and the terminals 1-3 are connected to the ground, i.e., the heaters 406-408 are power off. As the magnet 405 is arranged between the superconductors 401 and 402, it may be repelled by both a downward and an upward magnetic force. In the meantime, the magnet 405 may also be repelled from the left and right sides by the superconductors 403 and 404. Assuming that the gravitational force of the magnet 405 may be neglected. The repulsion from the superconductors 403 and 404 may be arranged weaker than the repulsion from the superconductors 401 and 402. The repulsive force of the superconductor 401 may be arranged larger than the repulsive force of the superconductor 402. The repulsive force of the superconductor 401 may be arranged relatively large enough such that the magnet 405 may be pushed against conductor regions 410 and 411 initially, as shown in FIG. 4A. FIG. 4A may correspond to a first memory state of the structure 400, where the circuits between terminals 1 &4 and 2 &4 are open.

Figure 4B:
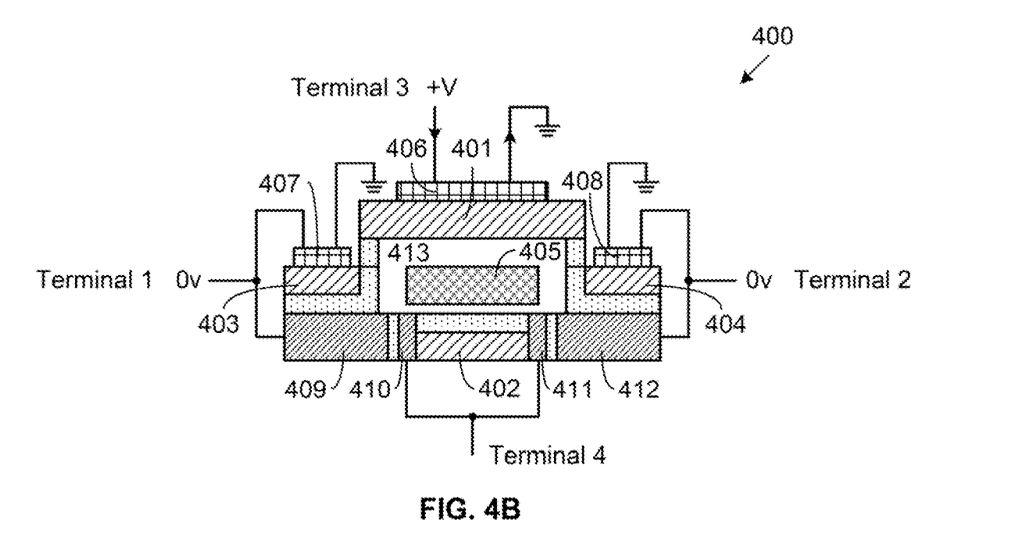

When an electric current is applied to the heater 406 after the terminal 3 is connected to an electric potential +V, the current may generate heat through Joule heating at the heater 406. The heat generated may spread to the superconductor 401. When the superconductor 401 is heated above the critical temperature, it loses the superconducting state and the repulsive force from it disappears. As a result, the repulsion from the superconductor 402 may push the magnet 405 upward until the magnet is stopped by the superconductor 401. However, if the current is arranged such that it only heats a part of the superconductor 401 above the critical temperature, the superconductor may lose superconductivity partially. As such, the magnet 405 is still repelled from two opposite directions vertically and may be suspended at an equilibrium position in the space 413, as shown in FIG. 4B. The magnet 405 may stay at a middle position horizontally because the repulsive forces from the left and right superconductors 403 and 404 may be similar.

In order to suspend the magnet 405 in the space 413, the current applied to the heater 406 may be arranged at a level which only heats a part of the superconductor 401 above the critical temperature. The current may be arranged in a pulsed form. In some embodiments, an upper portion of the superconductor 401 is heated to lose superconductivity when the heater 406 is disposed above the superconductor 401. Thus, the rest part of the superconductor 401 is still in the superconducting state and may repel the magnet 405. In some other embodiments, when the superconductor 401 is a thin film, one or more sections of the thin film may be heated by the heater 406 selectively. For example, the one or more sections may include a central section, a ring-shaped section, or a left and a right section. The heater 406 may include one or more separate heating elements for heating the one or more sections selectively. When the one or more sections of the thin film are heated, they lose superconductivity, while other sections may still be in the superconducting state. As a result, the repulsion from the superconductor 401 may be weakened by a certain degree and the magnet 405 may become suspended in the space 413.

Figure 4C:
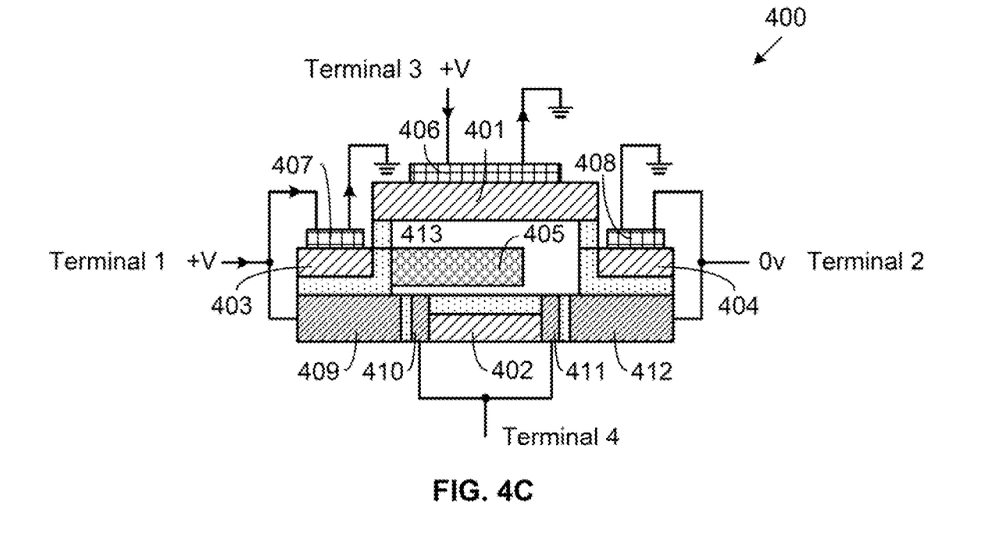
Figure 4D:
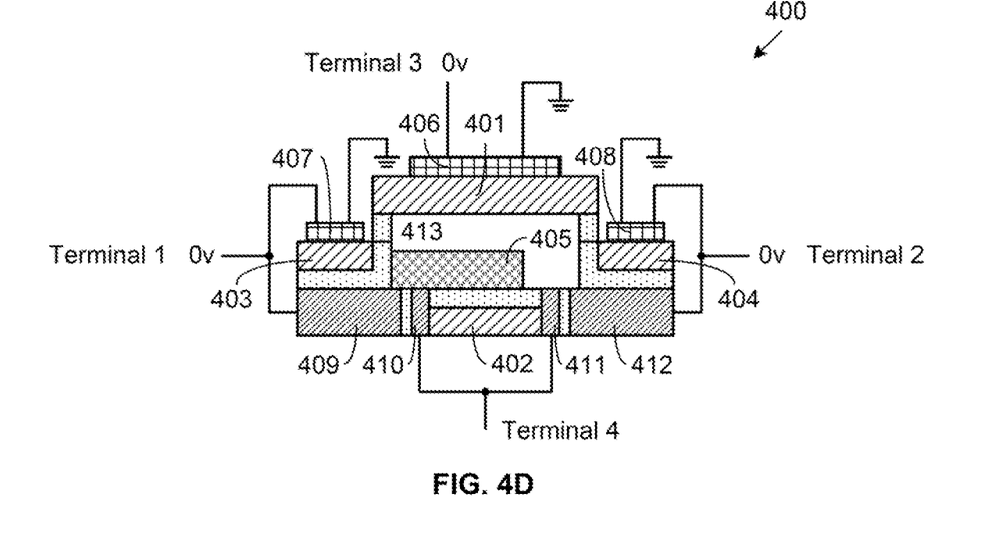

After the magnet 405 is suspended, another electric current may be injected to the heater 407, which may cause the superconductor 403 to lose superconductivity and the repulsion. As such, the magnet 405 may be pushed to the left side of the space 413 by the repulsive force of the superconductor 404 while still being suspended, as shown in FIG. 4C. Next, the current applied to the heater 406 may be stopped and the magnet 405 may be pushed downwards until it contacts the conductor regions 409 and 410. Then, the current to the heater 407 is stopped. The repulsion from the superconductor 403 may be arranged not strong enough to move the magnet 405 when the magnet is pushed against the bottom of the space 413. But the repulsion from the superconductor 403 or 404 may be arranged strong enough to move the magnet 405 when the magnet is suspended. Hence, the magnet 405 may stay put while contacting the conductor regions 409 and 410, as shown in FIG. 4D. The magnet 405 may couple the conductor regions 409 and 410 or the terminals 1 and 4 electrically, which may represent a second memory state of the structure 400. Next, if an electric current may be applied to heater 406, the top superconductor 401 may partially lose superconductivity again. Then, the magnet 405 may become suspended and may be moved laterally from the left side to a middle position by repulsive forces from the superconductors 403 and 404.

Similarly, the heaters 406 and 408 may be utilized to suspend the magnet 405 in the space 413 and then move it to the right side to contact conductor regions 411 and 412. Then the conductor regions 411 and 412 or the terminals 2 and 4 may become coupled electrically, which may represent a third memory state of the structure 400. Similarly, when an electric current is injected to heater 406, the top superconductor 401 may partially lose superconductivity again. Then, the magnet 405 may become suspended and may be moved laterally from the right side to the middle position by repulsive forces from the superconductors 403 and 404.

Thus, the superconductors 401-404 may be coupled together to generate a force field to control the movement and location of the magnet 405. The force field may be magnetic. The superconductors 401 and 402 may be considered as the first field element and the second field element, respectively. The superconductors 403 and 404 may be considered as the fourth field element and the fifth field element, respectively. Then, the first, second, fourth, and fifth field elements may be coupled together to create the force field to control the movement and location of the magnet 405.

As such, there may be three memory states at the structure 400. When the circuits between the terminals 1 & 4 and 2 & 4 are open, it may correspond to the first memory state. When the terminals 1 and 4 are connected while the circuit between 2 & 4 is open, it may correspond to the second memory state. When the terminals 2 and 4 are connected while the circuit between 1 & 4 is open, it may correspond to the third memory state. A memory state may be written by applying two electric currents to the two heaters. A memory state may be read by measuring the electrical resistance of circuits between terminals 1 & 4 and 2 & 4. Hence, the top and bottom superconductors 401 and 402 may be used to suspend the magnet 405. And the left and right superconductors 403 and 404 may be used to move the magnet 405 to the left, right, or the middle position. When a current is applied to the heated 406, the current may include one or more current pulses that may keep the magnet 405 suspended long enough so that the magnet may be moved laterally to a target position.

Figure 5A:
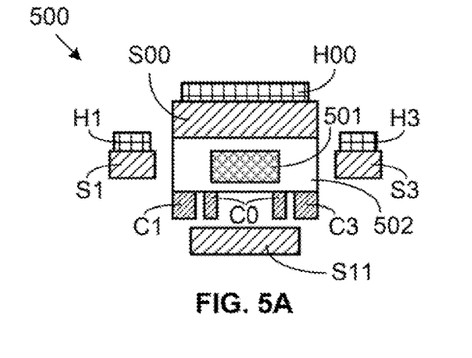
FIGS. 5A, 5B, 5C, and 5D illustrate schematic structural diagrams of another magnetic memory structure according to another embodiment of the present disclosure.
Figure 5B:
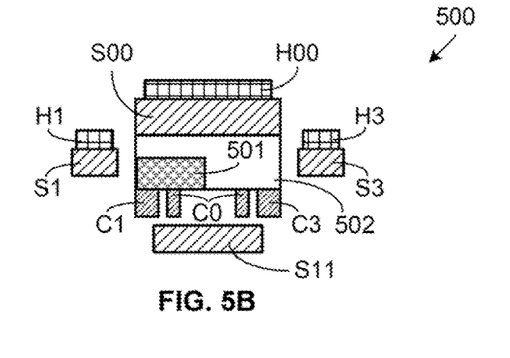
Figure 5C:
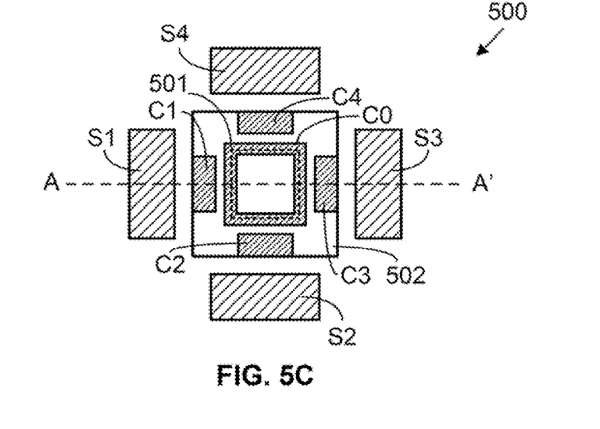
Figure 5D:
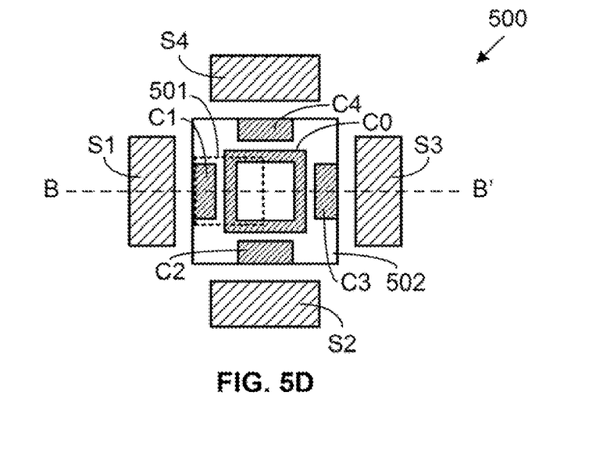

FIGS. 5A, 5B, 5C, and 5D show schematic structural diagrams of another nonvolatile magnetic memory structure 500, consistent with embodiments of the present disclosure. FIGS. 5A and 5B are cross-sectional views in a vertical plane along lines AA' and BB' in FIGS. 5C and 5D. FIGS. 5C and 5D are graphical descriptions of the structure 500 in top views. As shown in FIGS. 5A-5D, the structure 500 may include a top superconductor S00, a bottom superconductor S11, a left superconductor S1, a front superconductor S2, a right superconductor S3, a back superconductor S4, and a movable magnet 501. The top and bottom superconductors S00 and S11 may be arranged facing each other and separated by a first distance along a vertical direction. The left and right superconductors S1 and S3 may be arranged facing each other and separated by a second distance along a horizontal direction. The front and back superconductors S2 and S4 may be arranged facing each other and separated by a third distance along another horizontal direction. In some embodiment, the second and third distances may have a same value. In some other embodiment, the second and third distances may have different values. The movable magnet 501 may be surrounded by the six superconductors in vertical and horizontal directions.

The structure 500 may further comprise heaters H00, H1, H2 (not shown), H3, and H4 (not shown). The heater H00 may be disposed near and above the top superconductor 401. The heaters H1-H4 may be arranged near the superconductors S1-S4, respectively. The structure 500 may also comprise conductor regions C0, C1, C2, C3, and C4 at the bottom of a space 502. The conductor region C0 may be surrounded by the conductor regions C1-C4. The conductor regions C1-C4 may be arranged near the superconductors S1-S4, respectively. The six superconductors, five heaters, and five conductor regions may be separated and isolated from each other electrically by isolation layers or isolation regions. The isolation layers and regions, comprising one or more electrically insulating materials, are not shown in the figures for simplicity reasons. The space 502 may be surrounded by the six superconductors and the five conductor regions. The space 502 may provide a free space where the movable magnet 501 may move around in certain ways.

FIGS. 5C and 5D reflect schematic configurations of the structure 500 in top views where only selected items are presented. For example, the top and bottom superconductors S00 and S11 and the heaters are not shown. In addition, FIGS. 5C and 5D illustrate lateral relationship among the selected items. Some of the selected items, such as the superconductors S1-S4 and the conductor regions C0-C4, are not disposed in a same horizontal plane. In FIGS. 5C and 5D, the magnet 501 is represented by a square in dashed lines, which may be used to describe relative horizontal positions of the magnet 501 before or after a movement. FIGS. 5C and 5D don't show the relative vertical position of the magnet 501.

Like the superconductor 101, the superconductors S00, S11, and S1-S4 may comprise one or more superconductive materials. In some embodiments, the superconductors S1 and S3 may comprise a same structure, same dimensions, and same materials for producing similar repulsive forces in opposite directions. In addition, the superconductors S2 and S4 may be same, too. In some embodiments, superconductors S1-S4 may be thin films. The thin-film superconductors S1-S4 may be disposed on the sides of the space 502 with thin-film layers parallel to a vertical axis.

Like the magnet 103 of the structure 100, the movable magnet 501 may comprise one or more magnetic materials. The conductor regions C0-C4 may comprise one or more conductive materials. In some embodiments, the conductor region C0 may have a ring shape, such as a square ring shape, a circular ring shape, or an irregular ring shape.

The space 502 may be surrounded by the six superconductors, the five conductor regions, and parts of the isolation layers and regions. The top part of the space 502 may be defined by the superconductor S00. The bottom part of the space 502 may be defined by the superconductor S1l and the conductor regions C0-C4. The sidewalls may be defined by the superconductors S1-S4 and parts of the isolation regions. The heaters H00 and H1-H4 may be made of a high-resistivity material.

An example operation of the magnetic memory structure 500 is described below. Assuming that initially the temperature is below the critical temperature of the superconductors and the heaters are power off. As the magnet 501 is between the top and bottom superconductors S00 and S11, it may be repelled by both a downward and an upward magnetic force. In the meantime, the magnet 501 may also be repelled by superconductors S1-S4 along two horizontal directions. Assuming that the gravitational force of the magnet 501 may be neglected. The superconductors S1-S4 may generate similar repulsive forces that are weaker than repulsive forces from the superconductors S00 and S11. The repulsive force of the superconductor S00 may be arranged larger than the repulsive force of superconductor S11. The repulsive force of the superconductor S00 may be arranged relatively large enough such that the magnet 501 is pushed against the bottom of the space 502 when the heater H00 is power off. Assuming that the magnet 501 is pushed against a central area of the bottom of the space 502 initially and the magnet 501 is in contact with the conductor region C0. The initial position of the magnet 501 is depicted graphically in FIG. 5C. The magnet 501 is electrically coupled to the contact region C0 only, which may correspond to a first memory state.

When an electric current is applied to the heater H00, the current may generate heat through Joule heating and the heat may spread to the superconductor S00. When the superconductor S00 is heated above the critical temperature, it loses the superconducting state and the repulsive force from it disappears. As such, the repulsion from the superconductor S11 may push the magnet 501 upward until the magnet is stopped by the superconductor S00. However, if the current is arranged such that it only heats a part of the superconductor S00 above the critical temperature, the superconductor S00 may lose superconductivity partially. As such, the magnet 501 may still be repelled from two opposite directions vertically and thus may be suspended in the space 502, as shown in FIGS. 5A and 5C. The magnet 501 may be suspended at a central position of the space 502 in a horizontal plane because that the repulsive forces from the superconductors S1-S4 may be arranged similar.

In order to suspend the magnet 501, the current applied to the heater H00 is arranged at a level which only heats a part of the superconductor S00 above the critical temperature. As such, the repulsion from the superconductor S00 may be weakened but still strong enough to repel the magnet 501 and make it suspended in the space 502.

After the magnet 501 is suspended, another electric current may be injected to the heater H1, which may heat and cause the superconductor S1 to lose superconductivity and the repulsion. Then, the magnet 501 may be pushed to move toward the superconductor S1 by the repulsive force of the superconductor S3. Consequently, the magnet 501 may be suspended and pushed against a sidewall in front of the superconductor S1. Next, the current applied to the heater H00 may be stopped. The lost part of the repulsive force of the superconductor S00 may be regained. Thus, the magnet 501 may be pushed downwards until it contacts the conductor regions C1 and C0. Next, the current to the heater H1 may be stopped. As the repulsion from the superconductor S1 may be arranged relatively weak, the magnet 501 may stay put and keep contacting the conductor regions C1 and C0, as shown in FIGS. 5B and 5D. The magnet 501 may electrically couple the conductor regions C0 and C1, which may correspond to a second memory state of the structure 500.

Similarly, the heaters H00 and H3 may be utilized to suspend the magnet 501 in the space 502 and then move it to the right side. Then the magnet 501 may be in contact with the conductor regions C0 and C3 after the movement. As such, the conductor regions C0 and C3 may become coupled electrically, which may correspond to a third memory state of the structure 500.

Similarly, the heaters H00, H2, and H4 may be used to move the magnet 501 and cause it to contact conductor regions C0 and C2 or C0 and C4, respectively. As such, the conductor regions C0 and C2 may be coupled electrically, corresponding to a fourth memory state. And similarly, the conductor regions C0 and C4 may be coupled electrically, corresponding to a fifth memory state.

Thus, the superconductors S00, S11, and S1-S4 may be coupled together to generate a force field to control the movement and location of the magnet 501. The force field may be magnetic. The superconductors S00 and S11 may be considered as the first field element and the second field element, respectively. The superconductors S1 and S3 may be considered as the fourth field element and the fifth field element, respectively. The superconductors S2 and S4 may be considered as the sixth field element and the seventh field element, respectively. Then, the first, second, fourth, fifth, sixth, and seventh field elements may be coupled together to create the force field to control the movement and location of the magnet 501.

Therefore, five memory states may be arranged at the structure 500. The memory states may be detected by checking electrical resistance between the conductor region C0 and each of the conductor regions C1-C4, respectively. For example, if the resistance between C0 and C1 is relatively low, it may correspond to the second memory state. Thus, data may be written by applying electric currents to selected heaters. And data may be read by measuring electrical resistance between the conductor region C0 and each of the conductor regions C1-C4.

Figure 6:
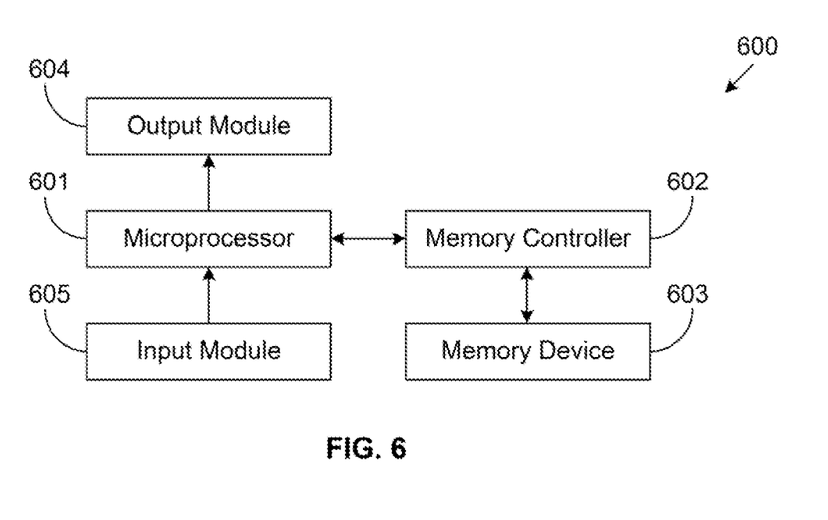
FIG. 6 illustrates a schematic block diagram of an electronic device according to another embodiment of the present disclosure.

FIG. 6 is a schematic block diagram illustrating an electronic device 600, consistent with embodiments of the present disclosure. The device 600 may include a computing device such as a desktop or portable computer, a server, a smartphone, a smart watch, and the like. The device 600 may also include a networking device (such as a switch or a router), a recorder of digital images, audio and/or video, a vehicle, an appliance, and a toy, etc. As shown, the device 600 may comprise a microprocessor 601, a memory controller 602, a memory device 603, an output module 604, and an input module 605.

The microprocessor 601 (e.g., central processing unit (CPU)) may control the overall operation of the electronic device 600, including the operation of the memory controller 602 and the output module 604. The output module 604 may include a display and/or a speaker. The input module 605 may include a keyboard, a key pad, a computer mouse, or a touch screen. In some embodiments, the output and input modules 604 and 605 may be combined using a touch screen. The microprocessor 601 may displays information stored at the memory device 603 through the output module 604 (e.g., a display) according to an input signal generated by the input module 605 (e.g., a keyboard).

The memory device 603 may comprise one or more memory regions. In some embodiments, each memory region may comprise one or more arrays of the magnetic memory structures described above. In some other embodiments, each memory region may comprise one or more arrays of the magnetic memory structures described above and one or more arrays of other types of memories. The memory controller 602 controls the operation of the memory device 603. The operations performed by the memory device 603 include erase, write, and read. In some embodiments, the memory device 603 may include a control circuitry. The memory controller 602 may control the memory device 603 via the control circuitry. In some other embodiments, the memory device 603 may not include any control circuitry. Then, the memory controller 602 may control the memory device 603 directly.

Although the principles and implementations of the present disclosure are described by using specific embodiments in the specification, the foregoing descriptions of the embodiments are only intended to help understand the method and core idea of the method of the present disclosure. In addition, the features of aforementioned different embodiments may be combined to form additional embodiments. Meanwhile, a person of ordinary skill in the art may make modifications to the specific implementations and application range according to the idea of the present disclosure. Hence, the content of the specification should not be construed as a limitation to the present disclosure.

What is claimed is:

1. A memory structure, comprising:
   a first field element comprising a superconductor;
   a second field element disposed facing the first field element, at a first distance from the first field element, and coupled to the first field element to create a force field;
   a movable magnetic element disposed in a space between the first field element and the second field element to be controlled by the force field, the movable magnetic element being repelled by the second field element; and
   a heater arranged near the first field element, the movable magnetic element moving toward the first field element in response to an electric current passing through the heater.

2. A memory device, comprising:
   a control circuitry; and
   at least one array of memory structures, each memory structure comprising:

a first field element comprising a superconductor;

a second field element disposed facing the first field element, at a first distance from the first field element, and coupled to the first field element to create a force field;

a movable magnetic element disposed in a space between the first field element and the second field element to be controlled by the force field, the movable magnetic element being repelled by the second field element; and a first heater arranged near the first field element, the movable magnetic element moving toward the first field element in response to a first electric current passing through the first heater.

3. The device according to claim 2, wherein the second field element comprises a superconductor.

4. The device according to claim 2, wherein the second field element comprises a first magnetic element.

5. The device according to claim 2, wherein each memory structure further including:

two conductors, the two conductors being electrically coupled after the movable magnetic element moves toward the first field element in response to the first electric current passing through the first heater.

6. The device according to claim 2, wherein each memory structure further including:

a third field element comprising a superconductor;

the first field element and the third field element disposed side by side and separated by a predetermined distance, the third field element facing the second field element and arranged close to the first heater, the first field element and the third field element being electrically coupled after the movable magnetic element moves toward the first field element in response to the first electric current passing through the first heater.

7. The device according to claim 2, wherein the first field element loses superconductivity partially in response to the first electric current passing through the first heater.

8. The device according to claim 7, wherein each memory structure further including:

a fourth field element comprising a superconductor;

a fifth field element comprising a superconductor and disposed facing the fourth field element and at a second distance from the fourth field element;

a second heater arranged near the fourth field element; and a third heater arranged near the fifth field element.

9. The device according to claim 8, wherein the movable magnetic element moves toward the fourth field element in response to a second electric current passing through the second heater.

10. The device according to claim 8, wherein each memory structure further including:

a sixth field element comprising a superconductor;

a seventh field element comprising a superconductor and disposed facing the sixth field element and at a third distance from the sixth field element;

a fourth heater arranged near the sixth field element; and a fifth heater arranged near the seventh field element.

11. The device according to claim 10, wherein the movable magnetic element moves toward the sixth field element in response to a third electric current passing through the fourth heater.

12. A method for fabricating an array of memory structures, comprising:

depositing a first layer of a first material;

forming a plurality of field elements out of the first material;

depositing a second layer of a first magnetic material, the second layer of the first magnetic material disposed between two layers of a filling material;

forming a plurality of magnetic elements out of the first magnetic material;

depositing a third layer of a conductive material;

forming a plurality of conductors out of the conductive material;

depositing a fourth layer of a first superconducting material;

forming a plurality of superconductors out of the first superconducting material;

depositing a fifth layer of an electrically resistive material; and forming a plurality of heaters out of the electrically resistive material;

wherein the plurality of magnetic elements becomes movable after the filling material that surrounds each magnetic element is removed.

13. The method according to claim 12, wherein the first material includes a second superconducting material.

14. The method according to claim 12, wherein the first material includes a second magnetic material.

15. An electronic device, comprising:

a microprocessor;

a memory device;

a controller controlling the memory device;

an output module; and an input module;

the memory device comprising at least one array of memory structures, each memory structure comprising:

a first field element comprising a superconductor;

a second field element disposed facing the first field element, at a first distance from the first field element, and coupled to the first field element to create a force field;

a movable magnetic element disposed in a space between the first field element and the second field element to be controlled by the force field, the movable magnetic element being repelled by the second field element; and a first heater arranged near the first field element, the movable magnetic element moving toward the first field element in response to a first electric current passing through the first heater.

16. The device according to claim 15, wherein each memory structure further including:

a third field element comprising a superconductor;

the first field element and the third field element disposed side by side and separated by a predetermined distance, the third field element facing the second field element and arranged close to the first heater, the first field element and the third field element being electrically coupled after the movable magnetic element moves toward the first field element in response to the first electric current passing through the first heater.

17. The device according to claim 15, wherein each memory structure further including:

two conductors;

the two conductors being electrically coupled after the movable magnetic element moves toward the first field element in response to the first electric current passing through the first heater.

18. The device according to claim 15, wherein the first field element loses superconductivity partially in response to the first electric current passing through the first heater.

19. The device according to claim 18, wherein each memory structure further including:

a fourth field element comprising a superconductor;
a fifth field element comprising a superconductor and disposed facing the fourth field element and at a second distance from the fourth field element;
a second heater arranged near the fourth field element; and
a third heater arranged near a sixth field element.

20. The device according to claim 19, wherein each memory structure further including:
the sixth field element comprising a superconductor;
a seventh field element comprising a superconductor and disposed facing the sixth field element and at a third distance from the sixth field element;
a fourth heater arranged near the sixth field element; and
a fifth heater arranged near the seventh field element.

* * * * *